(12) United States Patent
Bae (10) Patent No.: US 7,998,771 B2
(45) Date of Patent: Aug. 16, 2011

(54) MANUFACTURING METHOD OF LIGHT EMITTING DIODE INCLUDING CURRENT SPREADING LAYER

(75) Inventor: Sung Bum Bae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 88 days.

(21) Appl. No.: 12/446,635

(22) PCT Filed: Nov. 26, 2007

(86) PCT No.: PCT/KR2007/005995
§ 371 (c)(1),
(2), (4) Date: Apr. 22, 2009

(87) PCT Pub. No.: WO2008/069482
PCT Pub. Date: Jun. 12, 2008

(65) Prior Publication Data
US 2010/0240162 A1    Sep. 23, 2010

(30) Foreign Application Priority Data
Dec. 7, 2006   (KR) .................. 10-2006-0123959

(51) Int. Cl.
*H01L 21/00* (2006.01)
(52) U.S. Cl. ....... 438/39; 438/42; 438/47; 257/E33.005; 257/E33.006; 257/E33.011
(58) Field of Classification Search .............. 438/39, 438/42, 47; 257/E33.005, E33.006, E33.011
See application file for complete search history.

(56) References Cited

U.S. PATENT DOCUMENTS

| 5,739,553 | A | * | 4/1998 | Noto et al. ................. 257/94 |
| 6,037,603 | A | * | 3/2000 | Nelson ........................ 257/14 |
| 6,936,858 | B1 | | 8/2005 | Nakatsu et al. |
| 2004/0041164 | A1 | * | 3/2004 | Thibeault et al. ........... 257/98 |
| 2004/0084684 | A1 | * | 5/2004 | Tarsa et al. ................. 257/91 |
| 2004/0227142 | A1 | | 11/2004 | Izumiya |

(Continued)

FOREIGN PATENT DOCUMENTS

JP   2002-016312   1/2002

(Continued)

OTHER PUBLICATIONS

Kim K. H. et al., "III-nitride ultraviolet light-emitting diodes with delta doping", Applied Physics Letters, Jul. 21, 2003, vol. 83, No. 3, pp. 566-568.

*Primary Examiner* — Hsien-ming Lee
*Assistant Examiner* — Kevin Parendo
(74) *Attorney, Agent, or Firm* — Rabin & Berdo, P.C.

(57) ABSTRACT

Provided is a method of manufacturing a light emitting diode using a nitride semiconductor, which including the steps of: forming n- and p-type current spreading layers using a heterojunction structure; forming trenches by dry-etching the n- and p-type current spreading layers; forming an n-type metal electrode layer in the trench of the n-type current spreading layer; forming a p-type metal electrode layer in the trench of the p-type current spreading layer; and forming a transparent electrode layer on the p-type metal electrode layer, thereby improving current spreading characteristics as compared with the conventional method of manufacturing the light emitting diode, and enhancing operating characteristics of the light emitting diode.

7 Claims, 11 Drawing Sheets

U.S. PATENT DOCUMENTS

| | | | |
|---|---|---|---|
| 2005/0211994 A1* | 9/2005 | Erchak | 257/79 |
| 2006/0192207 A1 | 8/2006 | Wook Shim et al. | |
| 2007/0181894 A1* | 8/2007 | Stein et al. | 257/98 |

FOREIGN PATENT DOCUMENTS

| | | |
|---|---|---|
| JP | 2005-019653 | 1/2005 |
| JP | 2005-276899 | 10/2005 |
| KR | 2005-0068807 | 7/2005 |
| KR | 2006-0053469 | 5/2006 |
| KR | 100610639 | 8/2006 |
| KR | 2006-0104162 | 10/2006 |

* cited by examiner

MANUFACTURING METHOD OF LIGHT EMITTING DIODE INCLUDING CURRENT SPREADING LAYER

TECHNICAL FIELD

The present invention relates to a method of manufacturing a light emitting diode using III-group nitride semiconductors including nitrogen and III-group elements such as gallium (Ga), aluminum (Al), Indium (In), and in particularly, to a method of manufacturing a nitride light emitting diode including process of forming a 2-dimensional electron gas (2-DEG) layer and a 2-dimensional hole gas (2-DHG) layer which have low resistivity and high surface electron/hole concentration in a process of forming n- and p-type electrodes.

BACKGROUND ART

In general, III-nitride compound semiconductors have a direct bandgap, which is capable of controlling wavelengths from visible to ultraviolet, and excellent physical properties of high thermal and chemical stability, high electron mobility, and high saturation electron velocity, as compared with the GaAs and InP-related compound semiconductors. With these properties, the III-nitrides have been widely applied to the optical devices such as light emitting diodes (LED), and laser diodes (LD) for visible light; the electronic devices for wireless and satellite communication systems; and other fields that exceed the limitations of the existing compound semiconductor. The emission characteristics of the III-nitrides depend on the active layer, consisted of InGaN, GaN, AlGaN or InAlGaN, and a p-type electrode layer, taking lights from the active layer.

However, the emission properties of III-nitrides are difficult in increasing quantum efficiency due to a large lattice mismatch and growth temperature difference between the active layer and the electrode layer. Particularly, in the case of using a sapphire substrate, the current crowding effects easily occur because of a structure that the n-type and p-type electrodes are located on the same plane. Furthermore, in the case of p-type GaN, the current crowding is happened to the high resistivity and low mobility, so that light emission and heat generation are not uniform, thereby deteriorating the characteristics of the light emitting diode. Accordingly, to improve the characteristics of the light emitting diode, there have been researched various device structures and manufacturing processes which can decrease the current crowding.

DISCLOSURE OF INVENTION

Technical Problem

The present invention is directed to a method of manufacturing a nitride light emitting diode which employs a 2-dimensional electron gas (2-DEG) layer and a 2-dimensional hole gas (2-DHG) layer included in n- and p-type electrode layers as a current spreading layer, and includes a metal electrode layer deposited by forming trenches in the n- and p-type current spreading layers.

Technical Solution

To solve the above-subject problems, especially to improve current spreading characteristics of a light emitting diode, current spreading layers are formed within n- and p-type electrode layers. In other words, each electrode layer is etched to form a trench, and a metal electrode layer is deposited in the trench.

According to an aspect of present invention, a method of manufacturing a light emitting diode comprises the steps of: (a) forming a buffer layer on a substrate; (b) forming an n-type electrode layer on the buffer layer, the n-type electrode layer is consisted of a multi-layer structure including an n-type current spreading layer using a hetero-junction structure; (c) forming an active layer on the n-type electrode layer; and (d) forming a p-type electrode layer on the active layer, the p-type electrode layer is consisted of a multi-layer structure including a p-type current spreading layer using a hetero-junction structure.

The method may further comprise the steps of: (e) etching the p-type electrode layer after forming the p-type electrode layer, to expose the n-type current spreading layer of the n-type electrode layer; (f) forming n- and p-type trenches in the p-type current spreading layer and the n-type current spreading layers exposed by the etching, respectively; (g) inserting metal electrode layers into the respective trenches to form n- and p-type metal electrode layers; and (h) forming a transparent electrode layer on the p-type metal electrode layer.

Step (b) may comprise the steps of: (b1) forming an n-GaN layer for supplying electrons; (b2) forming the n-type current spreading layer with a hetero-junction structure of AlGaN/GaN on the n-GaN layer; and (b3) forming an n+-GaN layer on the n-type current spreading layer.

Step (d) may comprise the steps of: (d1) forming a p-GaN layer for supplying holes; (d2) forming the p-type current spreading layer with a hetero-junction structure of p-AlGaN/GaN on the p-GaN layer; and (d3) forming a p-type barrier layer on the p-type current spreading layer.

Each thickness of the n- and p-type trenches may range from one to three periods of the hetero-junction structure, and the p-type barrier layer may comprise a $p^+$-AlGaN layer having a thickness of 30~100 Å. To use the n-type current spreading layer as a two-dimensional electron gas layer, the AlGaN/GaN hetero-junction structure may comprise an undoped AlGaN layer and a GaN layer doped with Si. Further, to use the p-type current spreading layer as a two-dimensional hole gas layer, the p-AlGaN/GaN hetero-junction structure may comprise a p-AlGaN layer doped with Mg less than $10^{17}/cm^{-3}$ and a GaN layer doped with Mg more than $10^{17}/cm^{-3}$.

Advantageous Effects

As described above, the 2-DEG and 2-DHG structures formed by the hetero-junction are used for the n- and p-type current spreading layers, so that the current quickly flows on two-dimensional plane as compared with the bulk structure of the existing n-GaN and p-GaN. Thus, the partial current crowding and the non-uniform light emission, which arise in the existing large-sized light emitting diodes, are reduced, and thus it is possible to manufacture a large-sized light emitting diodes.

Further, in the foregoing configurations, the metal electrode is inserted within the trench, so that the metal electrode can be planarized by the following process as compared with the existing light emitting diode. Thus, various kinds of device can be integrated together with the light emitting diodes.

Also, The p-type electrode layer with the multi-layer structure for the current spreading include the current spreading layer based on the hetero-junction, the 2-DHG layer formed in the thin AlGaN layer, in the last layer of the epitaxial structure, and the transparent metal electrode layer. Accordingly, it is possible to overcome deterioration of the current spreading characteristics due to low hole mobility and high resistivity in the p-GaN, and to make the light emitting diodes with good uniformity and a large-size.

DESCRIPTION OF MAJOR SYMBOL IN THE ABOVE FIGURES

11: Substrate
12: Buffer layer
13: GaN support layer
14: n-type electrode layer
14a: n-GaN layer
14b: n-type current spreading layer
14c: n+-GaN layer
15: Active layer
16: p-type cladding layer
17: p-type electrode layer
17a: p-GaN layer
17b: p-type current spreading layer
17c: p-type barrier layer
18, 19: Trench
20, 21: Metal electrode layer
22: Transparent electrode layer

MODE FOR THE INVENTION

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

Figure 1:
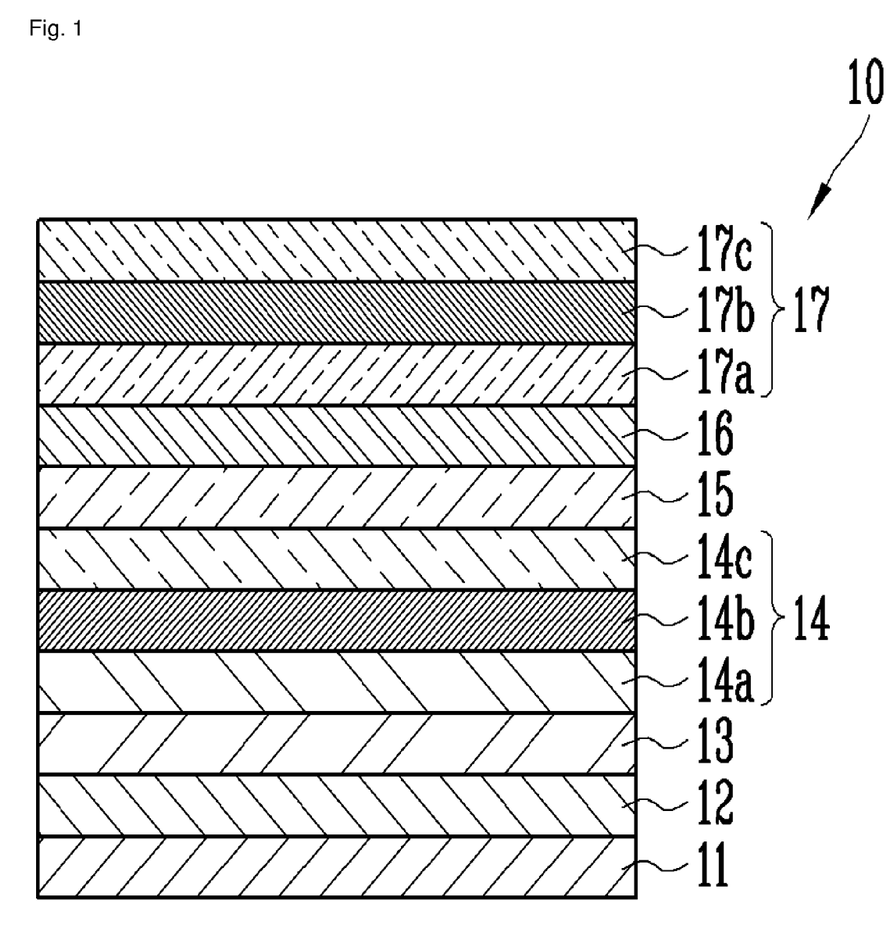
FIG. 1 is a schematic cross-sectional view of the nitride light emitting diode according to an exemplary embodiment of the present invention.

FIG. 1 is a cross-sectional view illustrating an epitaxial structure of the nitride light emitting diode according to an exemplary embodiment of the present invention. Referring to FIG. 1, the nitride light emitting diode 10 includes a substrate 11, a buffer layer 12 formed on the substrate 11, a GaN support layer 13 formed on the buffer layer 12, an n-type electrode layer 14 formed on the GaN support layer 13, an active layer 15 formed on the n-type electrode layer 14, a p-type cladding layer 16 formed on the active layer 15, and a p-type electrode layer 17 formed on the p-type cladding layer 16.

For example, the substrate 11 includes a sapphire substrate. The buffer layer 12 formed on the substrate 11 includes a low temperature buffer layer that is grown at a low temperature. The GaN support layer 13 formed on the low temperature buffer layer 12 includes an undoped GaN layer for enhancing crystallinity and is grown to a thickness of 2~3 µm.

Then, the n-type electrode layer 14 is formed on the GaN support layer 13, which includes an n-GaN layer 14a for supplying electrons, an n-type current spreading layer 14b formed on the n-GaN layer 14a and having a hetero-junction structure of AlGaN/GaN, and an n+-GaN layer 14c formed on the current spreading layer 14b as an n+ electrode layer. Here, the n-GaN layer 14a has an electron concentration of $3{\sim}5\times10^{18}$ cm$^{-3}$ and a thickness of 2~3 µm. Further, in the current spreading layer 14b with the hetero-junction structure of $Al_xGa_{1-x}N/GaN$, "x" for a composition ratio of Al ranges from 0.1 to 0.3, and each thickness of AlGaN and GaN ranges from 30 Å to 300 Å. To form the n-type current spreading layer 14b as a two-dimensional electron gas (2-DEG) layer, the AlGaN layer of the AlGaN/GaN hetero-junction structure is not doped and the GaN layer is doped with Si. Then, the n+-GaN layer 14c formed on the n-type current spreading layer 14b has an electron concentration of $3{\sim}5\times10^{18}$ cm$^{-3}$ and a thickness of 0.5~1 µm.

Then, the active layer 15 is formed on the n+ GaN layer 14c. The active layer 15 is grown to have a multiple quantum well (MQW) of InGaN/GaN for determining the emission wavelength. Then, the p-type cladding layer 16 is formed on the active layer 15 (i.e., the InGaN/GaN MQW) to serve as a current barrier. The p-type cladding layer 16 is a p-$Al_xGa_{1-x}N$ barrier, of which "x" for a composition ratio of Al ranges from 0.1 to 0.2 and the thickness ranges from 30 Å to 1,000 Å.

The p-type electrode layer 17 is formed on the p-type cladding layer 16. The p-type electrode layer 17 includes a p-GaN layer 17a for supplying holes, a p-type current spreading layer 17b formed on the p-GaN layer 17a and having a hetero-junction structure of AlGaN/GaN, and a p-type barrier layer 17c formed on the current spreading layer 17b. Here, the p-GaN layer 17a has a thickness of 500~5,000 Å. Further, in the p-type current spreading layer 17b formed on the p-GaN layer 17a and having a structure of p-$Al_xGa_{1-x}N/GaN$, "x" ranges from 0.1 to 0.3, and each layer thickness of AlGaN and GaN ranges from 30 Å to 300 Å. To form a two-dimensional hole gas (2-DHG) layer, the p-AlGaN layer is doped with Mg less than $10^{17}$ cm$^{-3}$ and the GaN layer is doped with Mg more than $10^{17}$ cm$^{-3}$.

The p-type barrier layer 17c is formed on the p-type current spreading layer 17b. The p-type barrier layer 17c has a structure of p+-AlGaN, of which "x" ranges from 0.1 to 0.3, the thickness ranges from 30 Å to 100 Å, and Mg doping is more than $10^{18}$ cm$^{-3}$. Thus, a top layer of a sample piece has a double hetero-junction structure of AlGaN/GaN(17b)/AlGaN(17c) to increase carrier confinement on the surface thereof, and forms a double current spreading layer of a p-type metal electrode layer inserted by a trench structure and a transparent electrode layer deposited on the p-type metal electrode layer.

Figure 8:
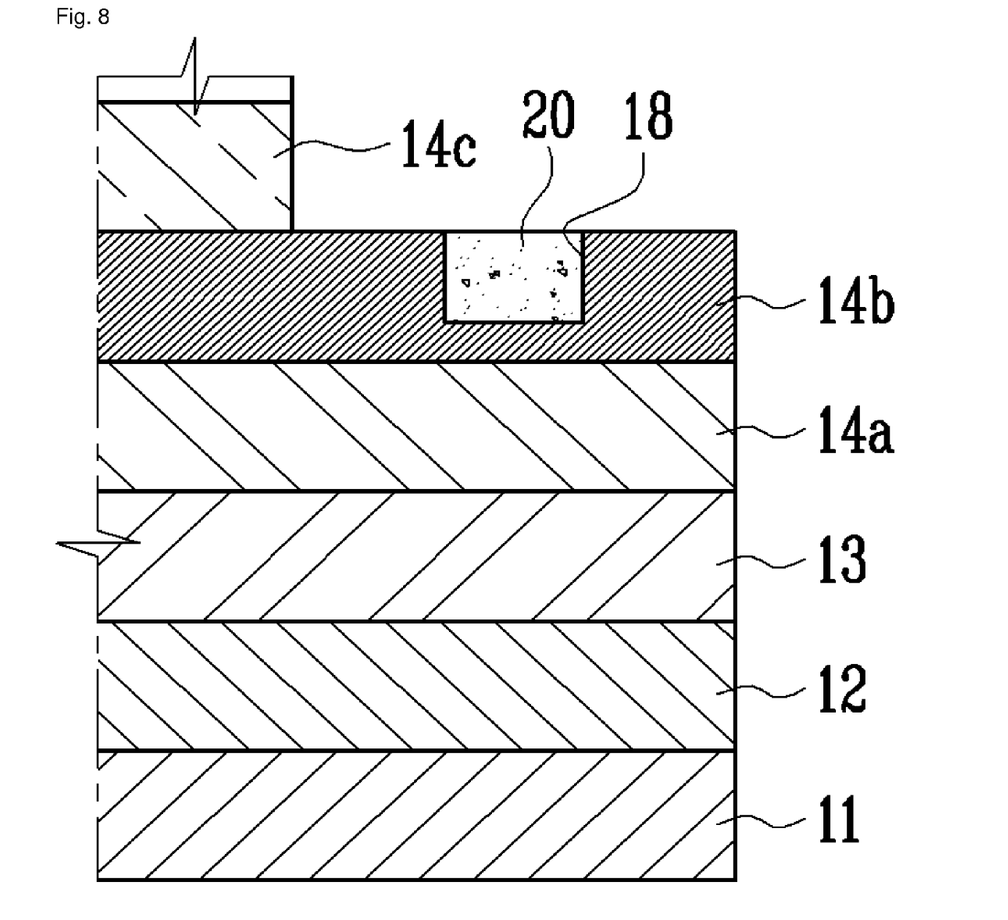
FIG. 8 is a cross-sectional view of a part (refer to "A" of FIG. 5) of the nitride light emitting diode, in which a trench formed in an n-type current spreading layer and a metal electrode are deposited, according to an exemplary embodiment of the present invention.
Figure 9:
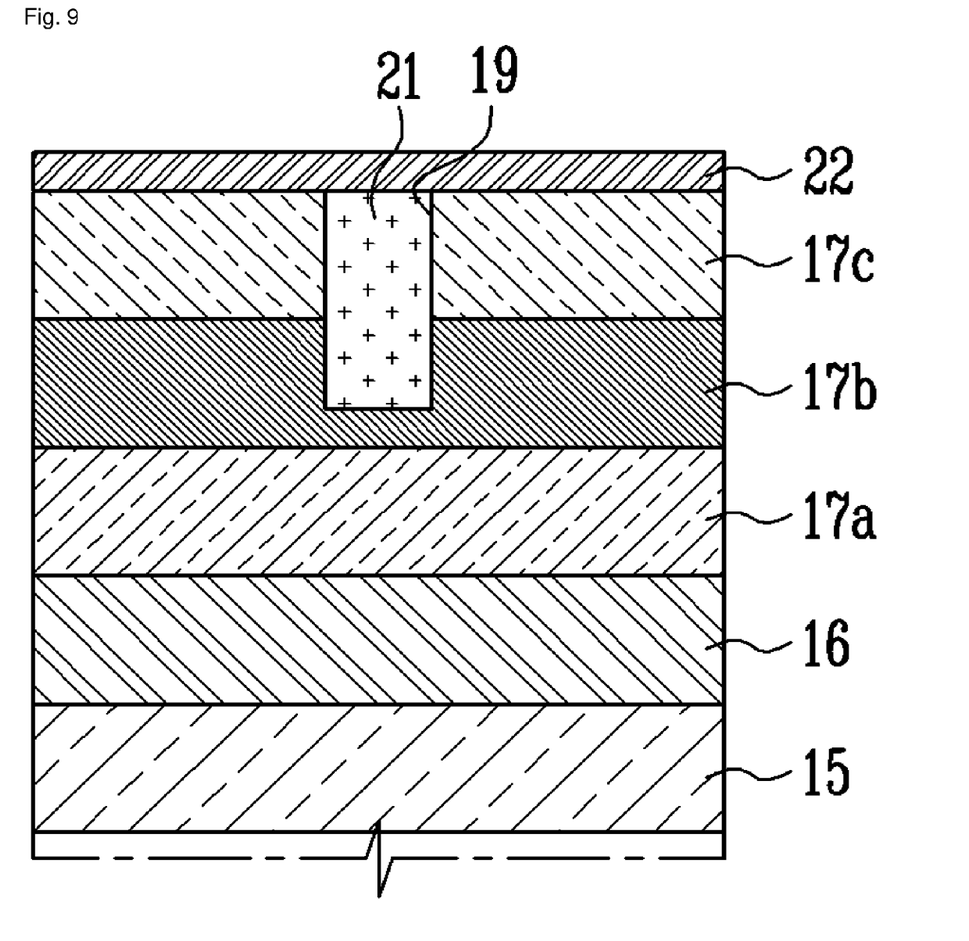
FIG. 9 is a cross-sectional view of a part (refer to "B" of FIG. 7) of the nitride light emitting diode, in which a trench formed in a p-type current spreading layer and a metal electrode are deposited, according to an exemplary embodiment of the present invention.

FIGS. 2 to 7 illustrate a manufacturing process of the nitride light emitting diode according to an exemplary embodiment of the present invention; FIG. 8 is a cross-sectional view of a part (refer to "A" of FIG. 5) of the nitride light emitting diode, in which a trench formed in an n-type current spreading layer and a metal electrode are deposited, according to an exemplary embodiment of the present invention; and FIG. 9 is a cross-sectional view of a part (refer to "B" of FIG. 7) of the nitride light emitting diode, in which a trench formed in a p-type current spreading layer and a metal electrode is deposited, according to an exemplary embodiment of the present invention.

Figure 2:
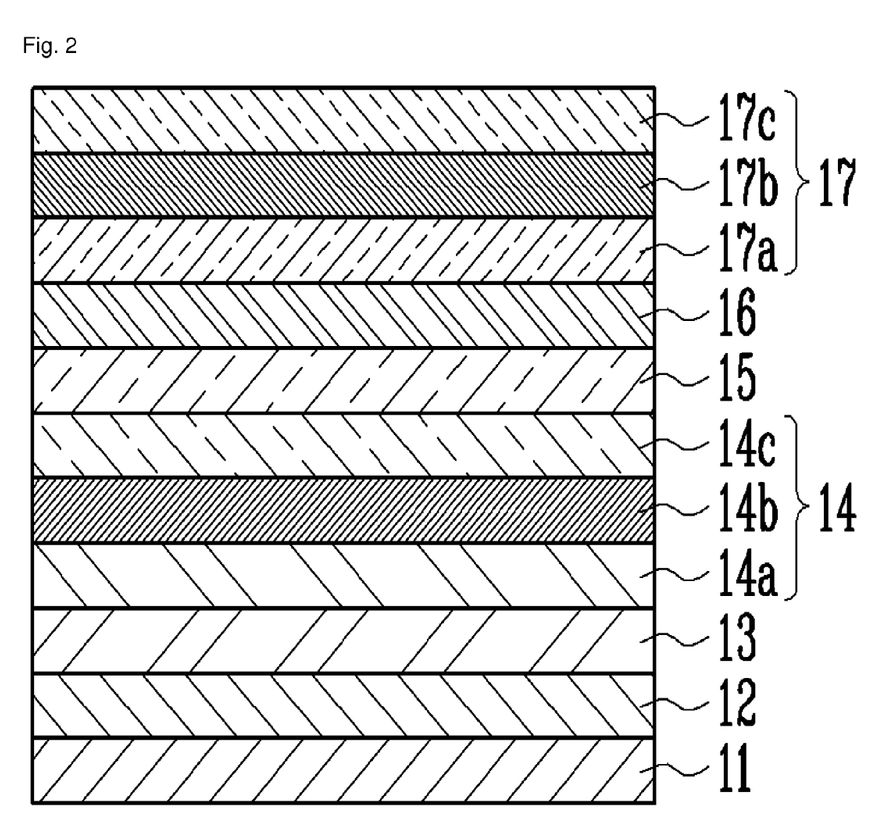
FIGS. 2 to 7 illustrate a process of manufacturing the nitride light emitting diode according to an exemplary embodiment of the present invention.

Referring to FIG. 2, the epitaxial structure of the light emitting diode is formed by stacking the substrate 11, the low buffer layer 12, the undoped GaN support layer 13, the n-GaN layer 14a, the n-type current spreading layer 14b, the n$^+$-GaN layer 14c, the active layer 15, the p-type cladding layer 16, the p-GaN layer 17a, the p-type current spreading layer 17b and the p-type barrier layer 17c.

Figure 3:
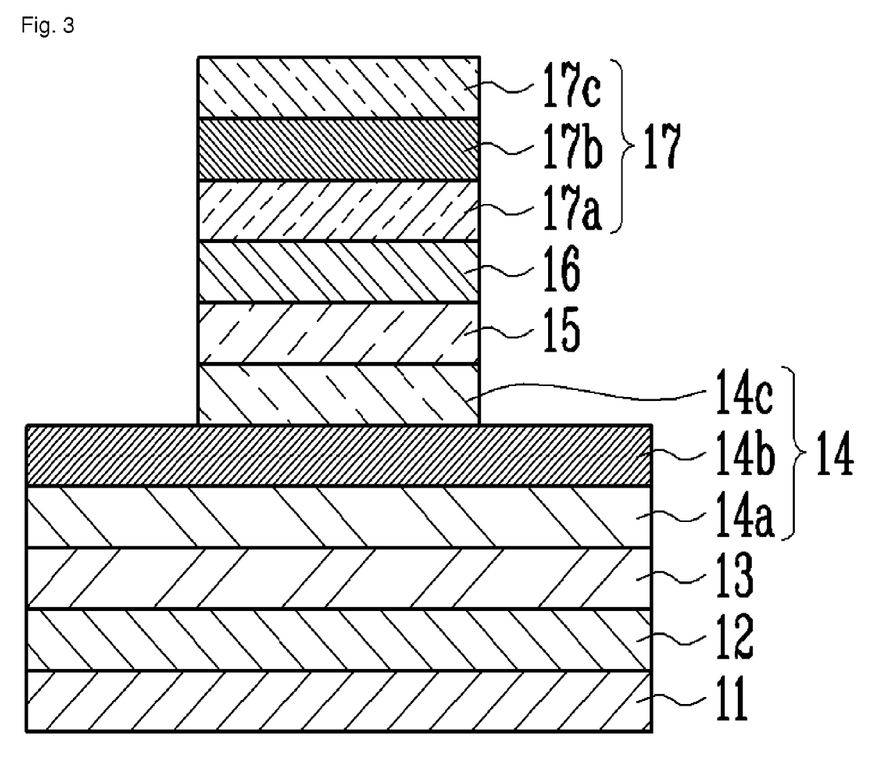
Figure 4:
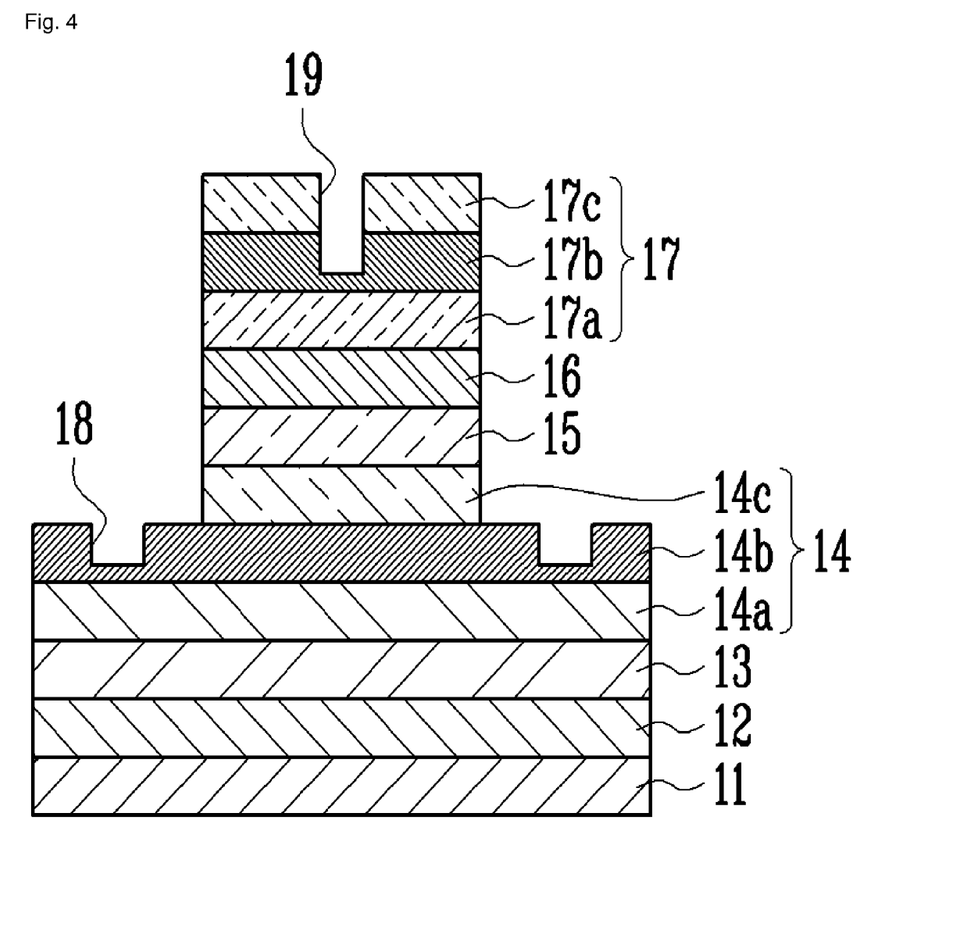

After completing the foregoing epitaxial structure, the stacked epitaxial structure undergoes an etching process from the p-type barrier layer 17c as the top layer to the n$_+$-GaN layer 14c (refer to FIG. 3). Then, the p-type barrier layer 17c and the exposed n-type current spreading layer 14b are etched to form trenches 18 and 19 (refer to FIG. 4). The trenches 18 and 19 are used for forming the n- and p-type metal electrodes, and the etching thickness is set to form the trenches 18 and 19 within the n- and p-type current spreading layers 14b and 17b, respectively. For example, the etching thickness is larger than one period and smaller than three periods of the hetero-junction of AlGaN/GaN.

Figure 5:
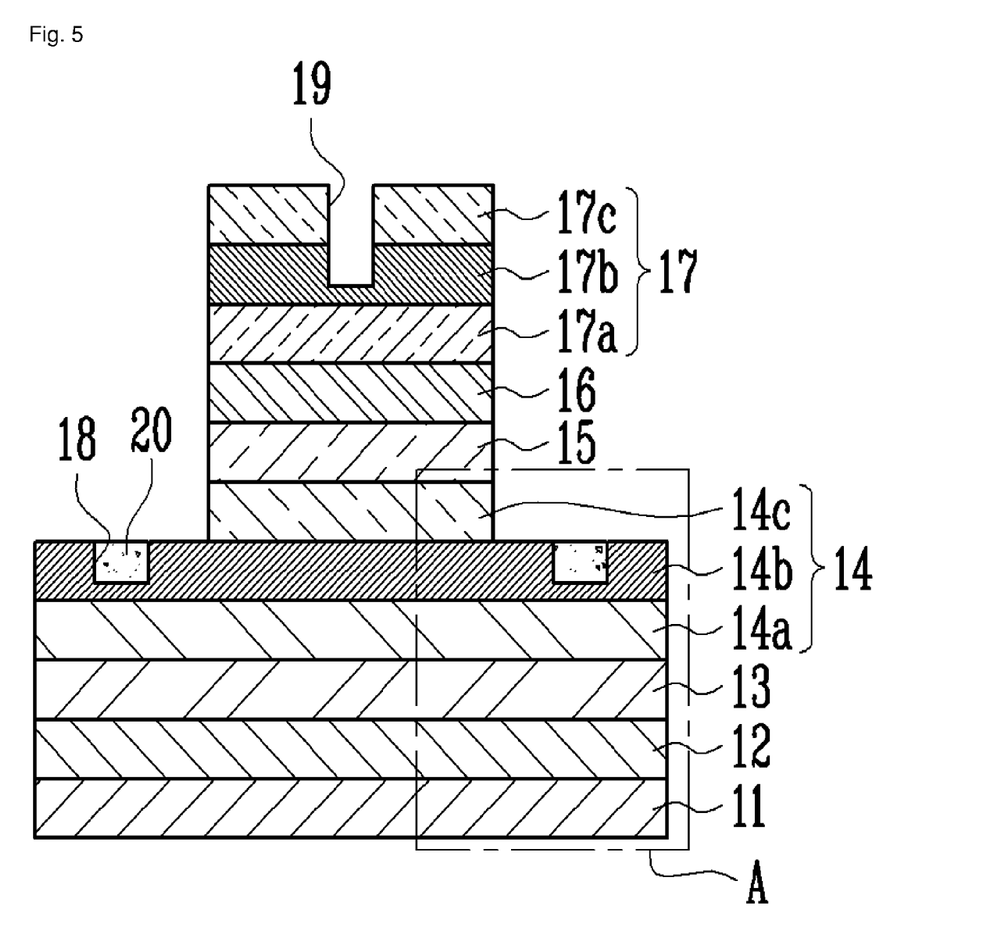

Referring to FIG. 5, an n-type metal electrode 20 is deposited within the trench 18 formed in the n-type current spreading layer 14b. In more detail, referring to FIG. 8, a primary etching process is applied from the p-type barrier layer 17c as the top layer to the n$^+$-GaN layer 14c of the n-type electrode layer 14; a secondary etching process is applied to the n-type current spreading layer 14b to form the trench 18; and then the metal electrode layer 20 is formed in the trench 18.

Figure 6:
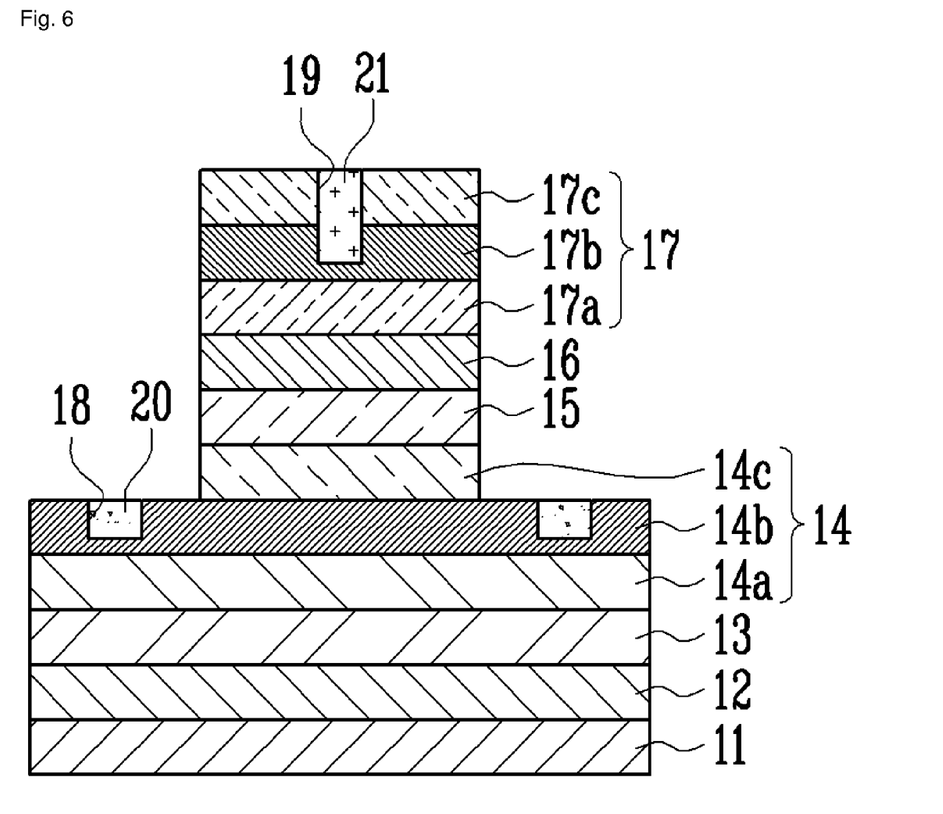

Referring to FIG. 6, a p-type metal electrode 21 is deposited within the trench 19 formed in the top p-type current spreading layer 17b. In more detail, referring to FIG. 9, the secondary etching process is applied to the p-type current spreading layer 17b formed under the p-type barrier layer 17c to form the trench 19, and the metal electrode layer 21 is formed within the trench 19. After forming the metal electrode layer 21 within the trench 19, the p-type barrier layer 17c and the metal electrode layer 21 are covered with a transparent electrode layer 22.

Figure 7:
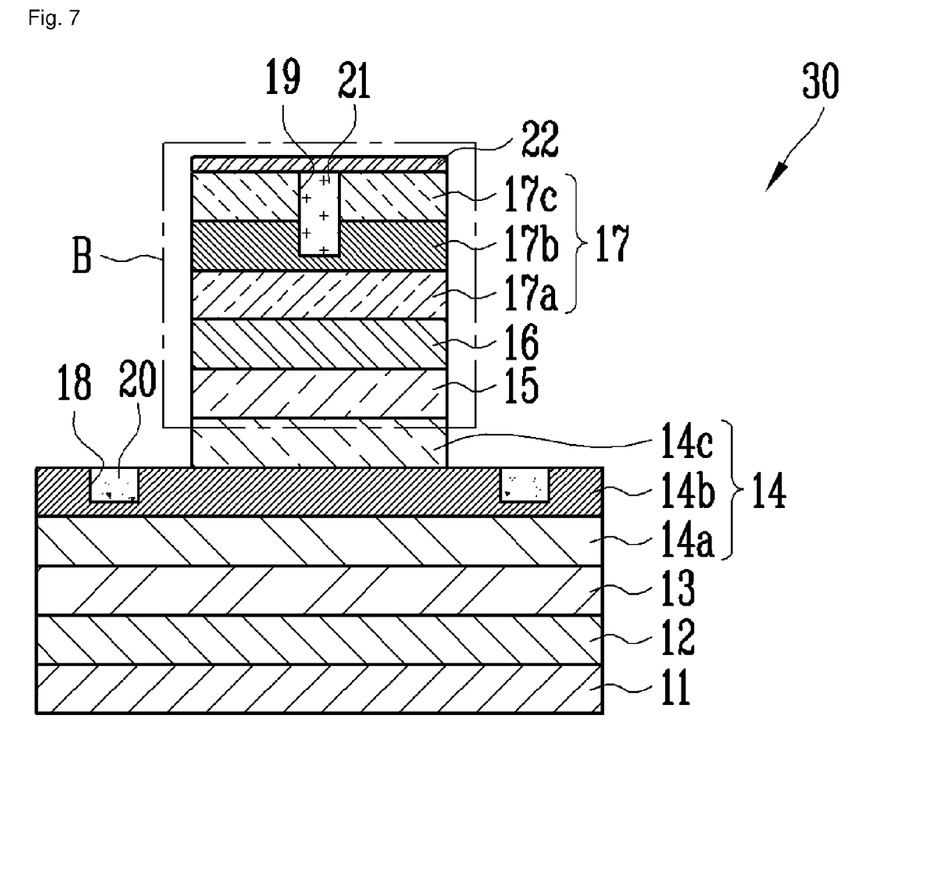

Referring to FIG. 7, the transparent electrode layer 22 is deposited on the p-type electrode layer 17 after depositing the n- and p-type metal electrode layers 20 and 21, thereby completing the nitride light emitting diode 30.

Figure 10:
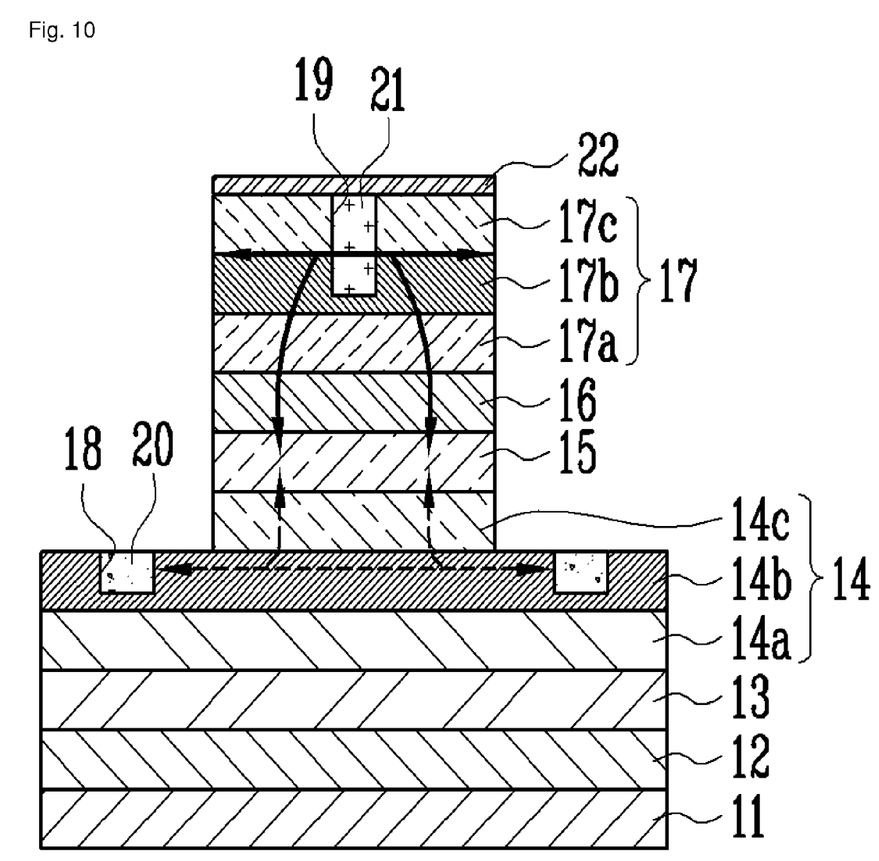
FIG. 10 illustrates a current flow through the n- and p-type current spreading layers deposited according to an exemplary embodiment of the present invention.

FIG. 10 illustrates a current flow through the n- and p-type current spreading layers deposited according to an exemplary embodiment of the present invention. As shown in FIG. 10, electrons are supplied to the n-type current spreading layer 14b through the n-GaN layer 14a, and then move to the metal electrode layers 20 formed at opposite sides of the n-type current spreading layer 146 or to the active layer 15 through the n$^+$-GaN layer 14c formed on the n-type current spreading layer 14b. Meanwhile, holes move to the p-GaN layer 17a through the p-type current spreading layer 17b and the p-type metal electrode layer 21, and then move to the active layer 15. Thus, the electrons and holes are moved to the active layer 15 and recombined to create excitons, thereby allowing the light emitting diode to emit light.

Figure 11:
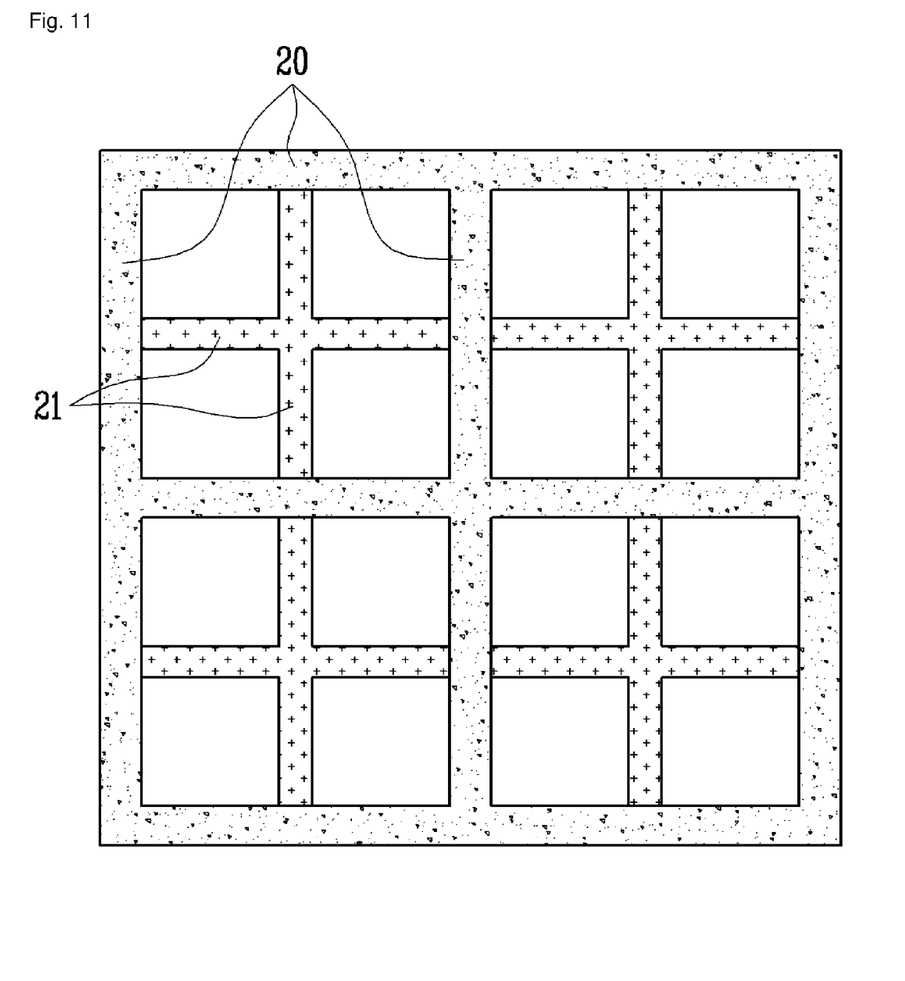
FIG. 11 is a plan view showing the layout of the n- and p-type electrode layers including a current spreading layer according to an exemplary embodiment of the present invention.

FIG. 11 is a plan view of a light emitting diode according to an exemplary embodiment of the present invention. As shown in FIG. 11, to achieve the characteristics of the light emitting diode by the n- and p-type current spreading layer, metal electrodes are crosswise arranged so that current flow is uniform throughout the light emitting diode, thereby enhancing current spreading characteristics of the light emitting diode. To enhance the current spreading characteristics, the area of the light emitting diode is quartered and the n-type metal electrode layer 20 is externally and internally arranged in a cross shape while the crosswise p-type metal electrode layer 21 is arranged within each quartered interior. Then, the transparent electrode layer 22 (refer to FIG. 9) is formed on the entire surface of the light emitting diode, thereby increasing a current spreading area and realizing a large-sized device.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A method of manufacturing a light emitting diode, comprising the steps of:
    (a) forming a buffer layer on a substrate;
    (b) forming an n-type electrode layer on the buffer layer, the n-type electrode layer having a multi-layered structure that includes an n-type current spreading layer, wherein the n-type current spreading layer includes a hetero-junction structure;
    (c) forming an active layer on the n-type electrode layer;
    (d) forming a p-type electrode layer on the active layer, the p-type electrode layer having a multi-layered structure that includes a p-type current spreading layer, wherein the p-type current spreading layer includes a hetero-junction structure;
    (e) etching the p-type electrode layer after forming the p-type electrode layer, to expose the n-type current spreading layer of the n-type electrode layer;
    (f) forming a first trench in the p-type current spreading layer and forming a second trench in a portion of the n-type current spreading layer that has been exposed by the etching;
    (g) inserting a first metal electrode layer into the first trench and inserting a second metal electrode layer into the second trench; and
    (h) forming a transparent electrode layer on the first metal electrode layer.

2. The method according to claim 1, wherein step (b) comprises:
    (b1) forming an n-GaN layer for supplying electrons;
    (b2) forming the n-type current spreading layer with the hetero-junction structure of AlGaN/GaN on the n-GaN layer; and
    (b3) forming an n$^+$-GaN layer on the n-type current spreading layer.

3. The method according to claim 1, wherein step (d) comprises:
    (d1) forming a p-GaN layer for supplying holes;
    (d2) forming the p-type current spreading layer with the hetero-junction structure of p-AlGaN/GaN on the p-GaN layer; and
    (d3) forming a p-type barrier layer on the p-type current spreading layer.

4. The method according to claim 2, wherein each depth of the first and second trenches ranges from one to three periods of the hetero-junction structure.

5. The method according to claim 3, wherein the p-type barrier layer comprises a p$^+$-AlGaN layer having a thickness of 30 to 100 Å.

6. The method according to claim 3, wherein the hetero-junction structure of AlGaN/GaN comprises an undoped AlGaN layer and a GaN layer doped with Si such that the n-type current spreading layer is a two-dimensional electron gas layer.

7. The method according to claim 3, wherein the heterojunction structure of p-AlGaN/GaN comprises a p-AlGaN layer doped with Mg at a concentration that is less than $10^{17}/cm^{-3}$ and a GaN layer that is doped with Mg at another concentration that is more than $10^{17}/cm^{-3}$ such that the p-type current spreading layer is a two-dimensional hole gas layer.

* * * * *